(12) United States Patent
Chiang

(10) Patent No.: US 8,051,898 B2
(45) Date of Patent: Nov. 8, 2011

(54) WATER COOLING TYPE HEAT DISSIPATION MODULE FOR ELECTRONIC DEVICE

(75) Inventor: Kuei-Fung Chiang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 1041 days.

(21) Appl. No.: 11/933,647

(22) Filed: Nov. 1, 2007

(65) Prior Publication Data

US 2009/0114375 A1  May 7, 2009

(51) Int. Cl.
*F28F 7/00* (2006.01)
*F28D 15/00* (2006.01)
*B29C 47/88* (2006.01)
*H05K 7/20* (2006.01)
*F04B 23/00* (2006.01)
*F04B 35/04* (2006.01)

(52) U.S. Cl. .................. 165/80.4; 165/104.28; 165/120; 361/698; 361/699; 417/313; 417/423.1

(58) Field of Classification Search .................. 165/80.4, 165/61, 80, 100, 104.33, 10, 182, 213, 214, 165/216; 266/109; 361/699, 712; 417/313, 417/423.1, 423.14; 415/211.2, 206, 204, 116

See application file for complete search history.

(56) References Cited

U.S. PATENT DOCUMENTS

| 6,999,316 B2* | 2/2006 | Hamman | 361/701 |
| 7,688,589 B2* | 3/2010 | Chiang | 361/699 |
| 2006/0171801 A1* | 8/2006 | Manabe et al. | 415/176 |

* cited by examiner

*Primary Examiner* — Judy J Swann
*Assistant Examiner* — Jason Thompson

(57) ABSTRACT

A water cooling type heat dissipation module for an electronic device includes a base disk, a suction disk, a water guide and a cover. The base has two containing spaces and a plurality of cooling strips in the containing space. The suction base is attached to the base disk and further includes two water chambers for receiving sucked water, two inlets and two outlets. The water guide is attached to the suction disk with two guide port at the periphery thereof. The cover closes the suction disk and is movably joined to a guide fan. When the heat dissipation module is full with fluid, the fluid can flow therein rapidly while the guide fan rotating such that the fluid is discharged from and flows into the heat dissipation module more effectively.

10 Claims, 8 Drawing Sheets

WATER COOLING TYPE HEAT DISSIPATION MODULE FOR ELECTRONIC DEVICE

BACKGROUND OF THE INVENTION

1. Field of the Invention

The present invention is related to a water cooling type heat dissipation module and particularly to a heat dissipation module with which a guide fan is associated for speeding up circulation of cooling water to enhance efficiency of heat exchange.

2. Brief Description of the Related Art

Many electric circuits being formed as electronic components or electronic circuits being formed of a plurality of integrated circuits joining to each other that were developed in the early stages have more and more been replaced with a comfortable integrated circuit due to growing technology of the integrated circuit and progressive manufacturing process of the semiconductor. That is, an integrated circuit is capable of performing more functions and is capable of processing more complicated instructions and signals. It is inevitable that a great deal of amount of heat is generated during the electronic component is in operation. In order to avoid temperature rise effect occurs at the time of the large amount of heat is generated to influence operation of the electronic component, proper heat dissipation becomes a subject worth to be paid attention and placing the heat dissipation device on the electronic component has been a popular technique nowadays.

When the integrated circuit with a unchanged volume contains more electronic components such as FET (Field Effect Transistor) and COMS, more heat is generated while the integrated circuit is in operation. Heat generated from the integrated circuit developed in the early stages such as the conventional central processing unit can be dissipated sufficiently with mere cooling fins. However, heat generated from the central processing unit developed in the recent years is unable to be dissipated with the cooling fins only and a fan for removing heat becomes a required device in addition to the cooling fins. Normally, the cooling fins have a base for being attached to the integrated circuit such that the heat can be removed outward with the fan, which is disposed at the tops of the cooling fins. Because there is a distance between the base of the cooling fins and the fan, the heat received by the base is incapable of transmitting to the tops of the cooling fins immediately. As a result, most of the heat accumulates at the base to deteriorate efficiency of heat dissipation. In order to increase the efficiency of heat dissipation, guide heat pipes are employed in the cooling fins to speed up removal of the heat with air cooling. Further, water cooling type heat dissipation is applied to add water in the guide heat pipes and the guide heat pipes are connected to a water tank and a pump for cooling water being able to circulate between the water tank and the guide heat pipes for enhancing removal of heat done with guide heat pipes.

The preceding water cooling type heat dissipation allows the cooling water moving in the guide heat pipes to perform heat exchange between the cooling water and the heat in the guide heat pipes only. However, the heat generating component such as the central processing unit contacts with the cooling fins directly instead of the guide heat pipes such that the heat received with the cooling fins are still incapable of being directly dissipated effectively.

SUMMARY OF THE INVENTION

In order to overcome the deficiencies of the preceding prior art, an object of the present invention is to provide a water cooling type heat dissipation module for an electronic device, which is capable of removing heat of the heat generating component rapidly and providing faster circulation of cooling water.

Accordingly, a heat dissipation module for an electronic device according to the present invention includes a base disk, a suction disk, a water guide and a cover. The suction disk and the water guide are provided between the cover and the base disk. The cover has a receiving shell for receiving a guide fan. The guide fan provides a plurality of blades and a guide opening is disposed between adjacent the blades. The base disk has two containing spaces and a plurality of cooling strips. The suction disk is attached to the base disk and provides two water chambers, an inlet and an outlet. The water guide is attached to the suction disk with guide ports at the periphery thereof. When the heat dissipation module is full with fluid, the fluid can flow therein rapidly while the guide fan rotating such that the fluid moves to the water passages in the suction disk and flows into the water guide via the water hole and then flows downward to the two containing spaces of the base disk via the guide port of the water guide and finally is discharged outward with a water pipe after passing through the outlet of the suction disk, the discharge pipe connector of the cover.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
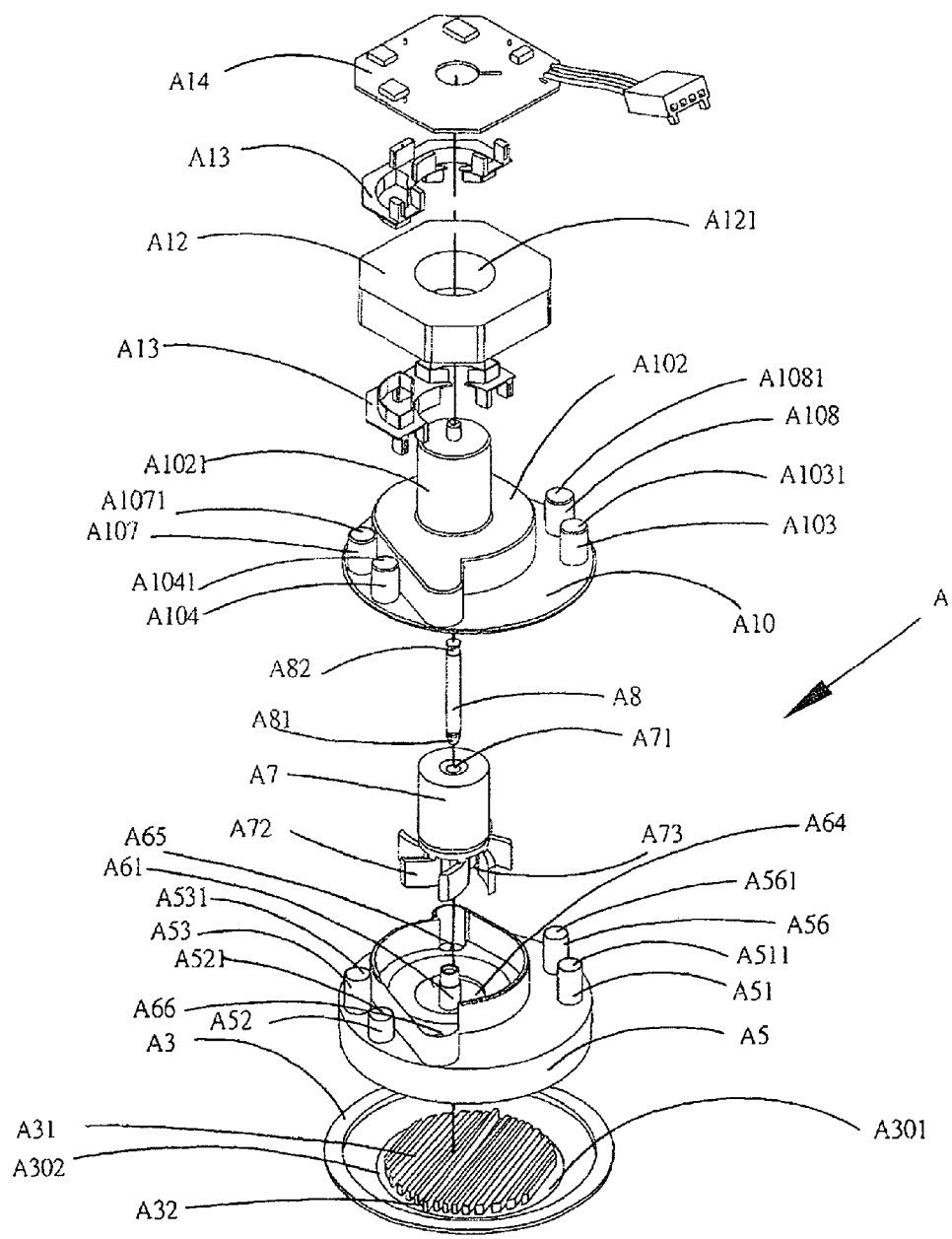
FIG. 1 is an exploded perspective view of a water cooling type heat dissipation module for an electronic device according to the present invention.

Referring to FIG. 1, the preferred embodiment of a water cooling type heat dissipation module according to the present invention includes a suction disk A5, a base disk A3, a water guide A6, a guide fan A7, a spindle A8, a cover A10, a motor A12, a motor seat A13 and a printed circuit (PC) board A14.

Figure 4:
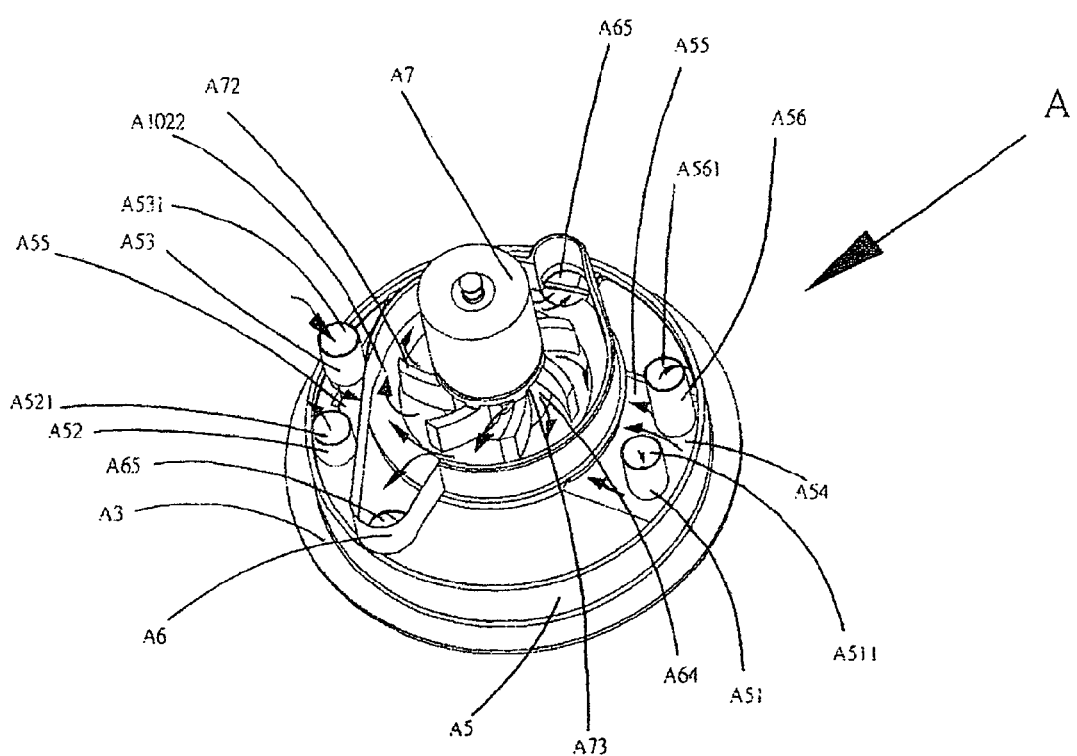
FIG. 4 is a perspective view of the water cooling type heat dissipation module of the present invention except the cover, the motor and the printed circuit board.

Wherein, the base disk A3 has a containing space A30 and a plurality of cooling strips A31. Further, a baffle fin A32 is provided at the middle of containing space A30 among the cooling strips A3 for separating the containing space A30 into two independent containing space sections while the suction disk A5 is attached to the base disk A3; the suction disk A5 is disposed on top of the base disk and provides a first and second inlets A51, A53 and a first and second outlets A52, A56, wherein the first inlet A51 is disposed to be diagonally opposite to the second inlet, and the first outlet A52 is disposed to be diagonally opposite to the second outlet A56. The water guide A6 is disposed on the suction disk A5 and has a water hole A64 communicating with the first and second inlets A51, A53 of the suction disk A5. There are a first and second guide ports A65, A66 oppositely disposed at the periphery of the water guide A6, and the guide ports A65, A66 extend to the bottom of the suction disk A5 for the fluid being capable of flowing unidirectionally; an end of the spindle A8 passes through a central hole of the guide fan A7 to fixedly join with a spindle seat A61 on the suction disk A5; and the cover A10 has a receiving shell A1021 on top of the bulge part A102 of the cover A10 for engaging with the upper end of the water guide A6 so as to constitute a containing space A1022 as shown in FIG. 4. A first and second intake pipe connectors A103, A107 and a first and second discharge pipe connectors A104, A108 are provided at the top of the cover A10, wherein the first and second intake pipe connectors A103, A107 are disposed corresponding to the first and second inlets A51, A53 respectively and diagonally opposite to each other, and the first and second discharge pipe connectors A104, A108 are disposed corresponding to the first and second outlets A52, A56 respectively and diagonally opposite to each other.

Figure 2:
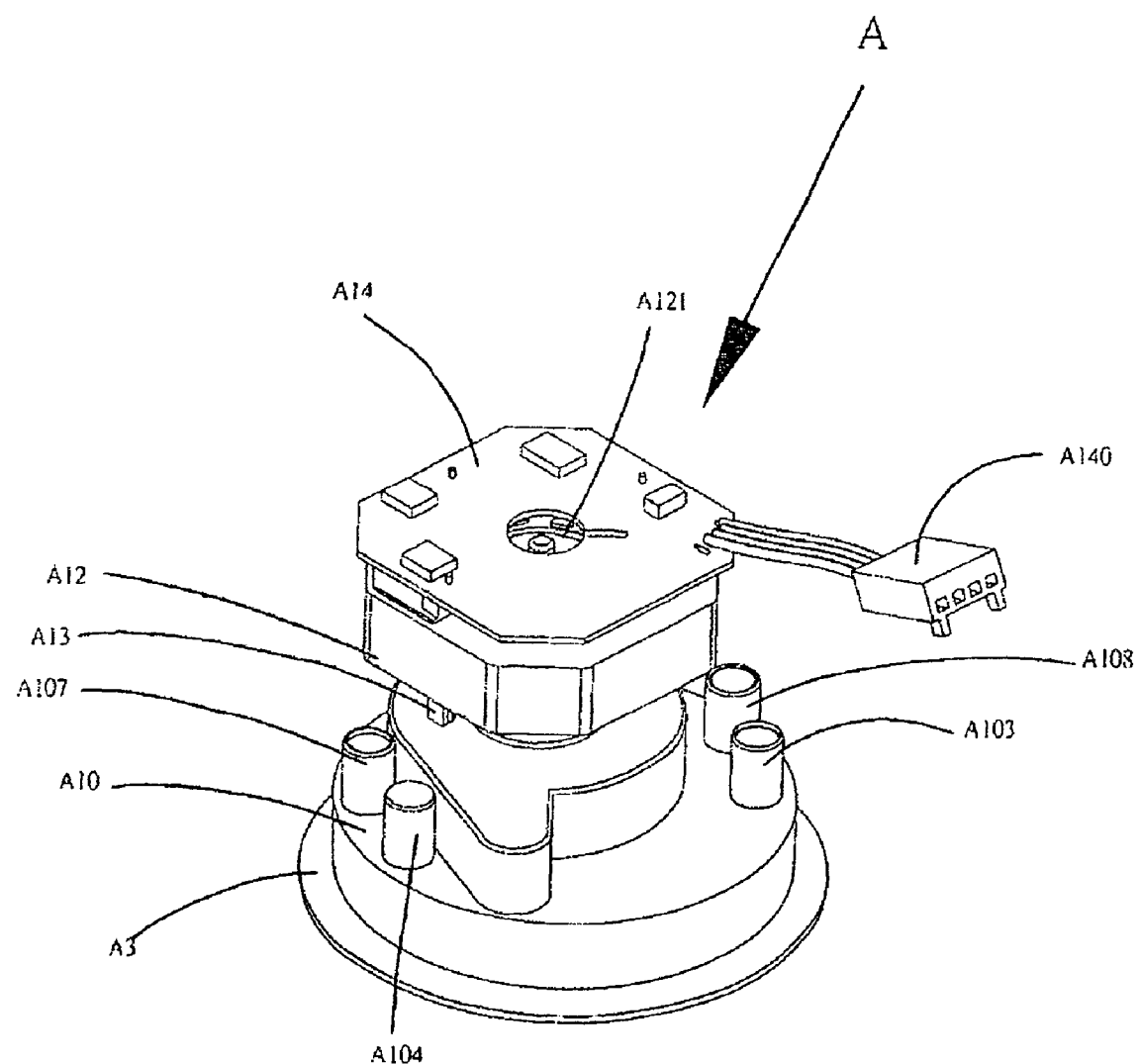
FIG. 2 is an assembled perspective view of FIG. 1.

Referring to FIG. 2 in company with FIG. 1, it can be seen that the heat dissipation module A has the PC board A14 with power wiring A140 thereon for supplying power needed by the heat dissipation module A. The motor A12 is provided under the PC board A14 with an inner hole A121 therein fitting with the outer surface of the receiving shell A1021 (see FIG. 1). The motor A 12 is attached to the second end A82 of the spindle A8 such that the guide fan A7 is capable of being driven to rotate with the motor A12. The PC board A14 is employed to control actuation of the motor A12. The motor seat A13 is disposed between the motor A12 and the recess A102 for securing the motor A12 to the recess A102.

Figure 3:
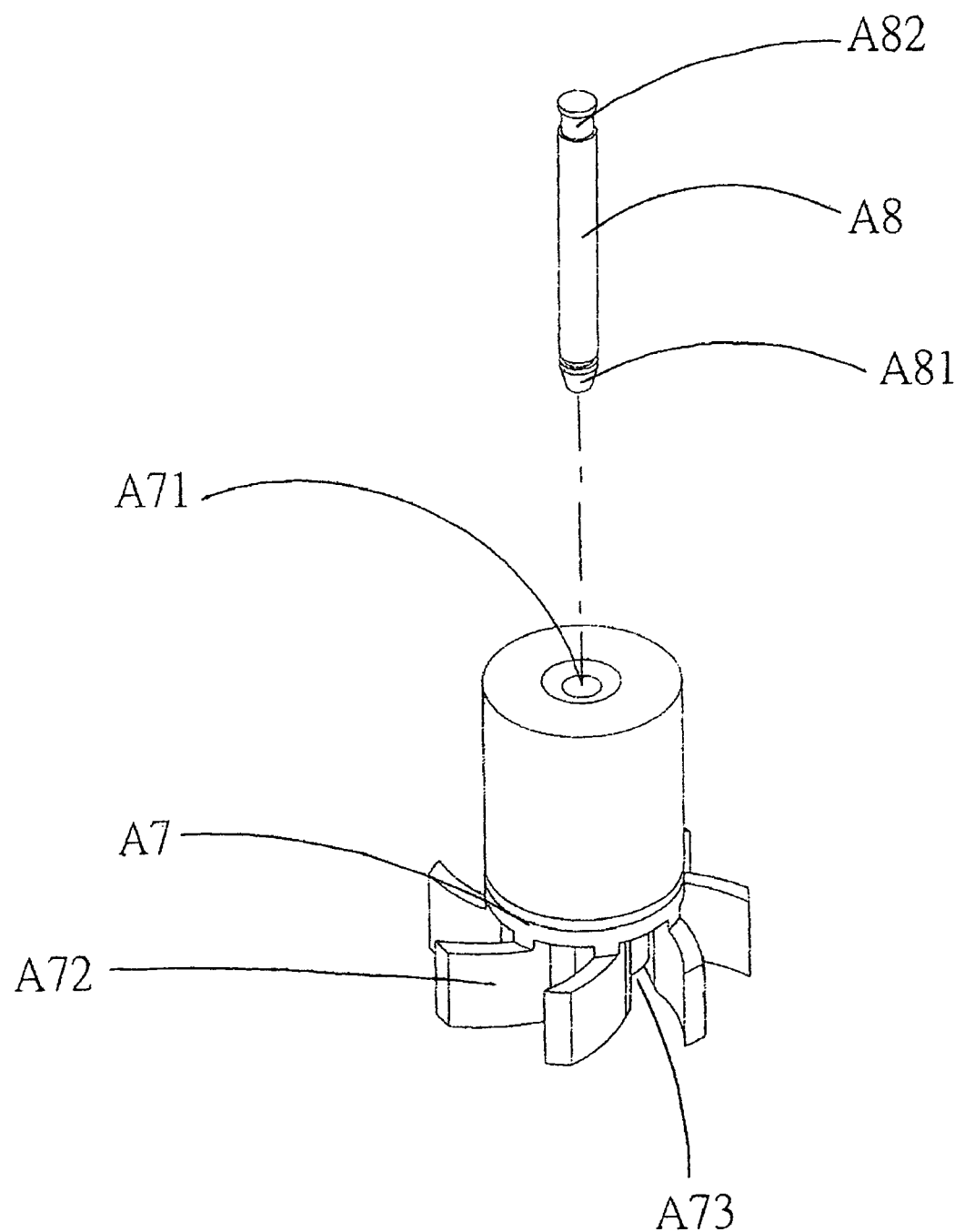
FIG. 3 is an enlarged disassembled perspective view of the guide water fan shown in FIG. 1.

Referring to FIG. 3, the first end A81 of the spindle A8 extends through the inner hole A71 to engage with the guide fan A7 and the second end A82 of the spindle A8 is joined to the motor A12 (see FIG. 2) such that the guide fan A7 is capable of rotating with the spindle A8 while the spindle A8 is driven with the motor A12. In addition, the blades A72 are capable of rotating with the guide fan A7 such that the fluid, which enters the blades A72 via a guide opening A73, can be guided to a flow direction with the blades A72.

Figure 5:
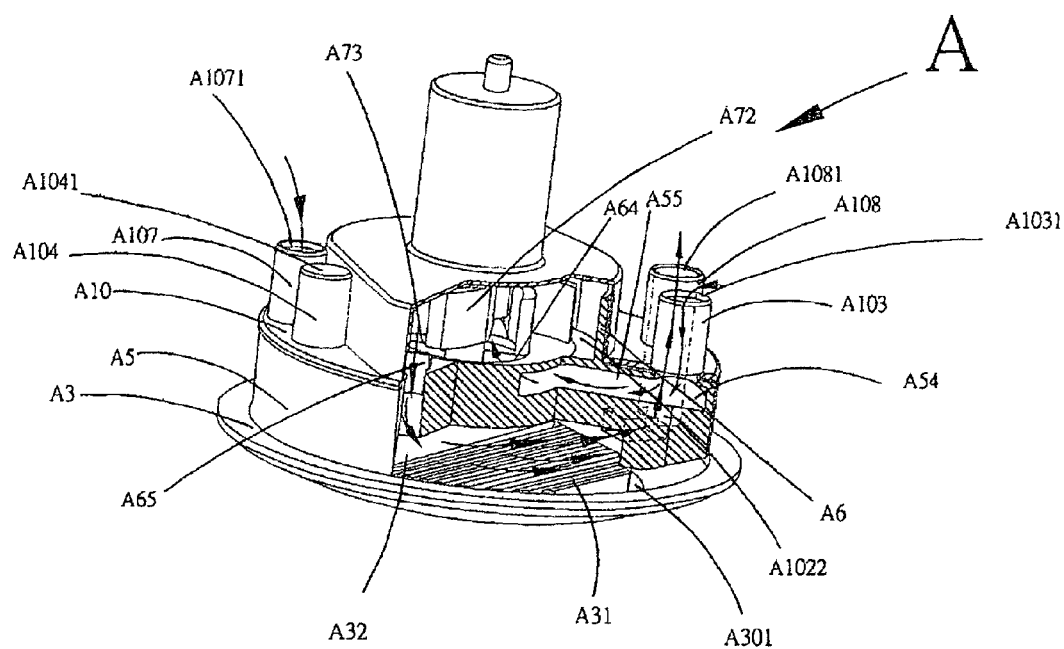
FIG. 5 is a perspective sectional view of the water cooling type heat dissipation module of the present invention except the motor and the printed circuit board illustrating fluid flowing in the heat dissipation module.

Referring to FIGS. 4 and 5, it can be clearly seen that the fluid enters a suction space A54 provided at the suction disk A5 via the inlets A51, A53 of the water suction disk A5. Then, the fluid moves along a water passage A55 to reach the water hole A64 at the bottom of the water guide A6. Hence, the guide openings A73 provided at the guide fan A7 are capable of guiding the fluid into the guide fan A7 and the blades A72 rotate to carry the water to the guide ports A65, A66 for the fluid flowing downward into the containing spaces A301, A302 respectively (see FIG. 1) of the base disk A3. Heat received by the cooling strips A31 at the bottom of the base disk A3 can be carried outward while the water in the containing spaces A301, A302 is in a state of moving. The fluid outward the containing spaces A301, A302 move toward the first discharge port A571 of the first chamber A57 and the second discharge port A581 of the second chamber A58 at the bottom of the suction disk A5. Thus, the fluid is capable of flowing to exits A1041, A1081 of the discharge pipe connectors A104, A108 as shown in FIG. 7

Figure 6:
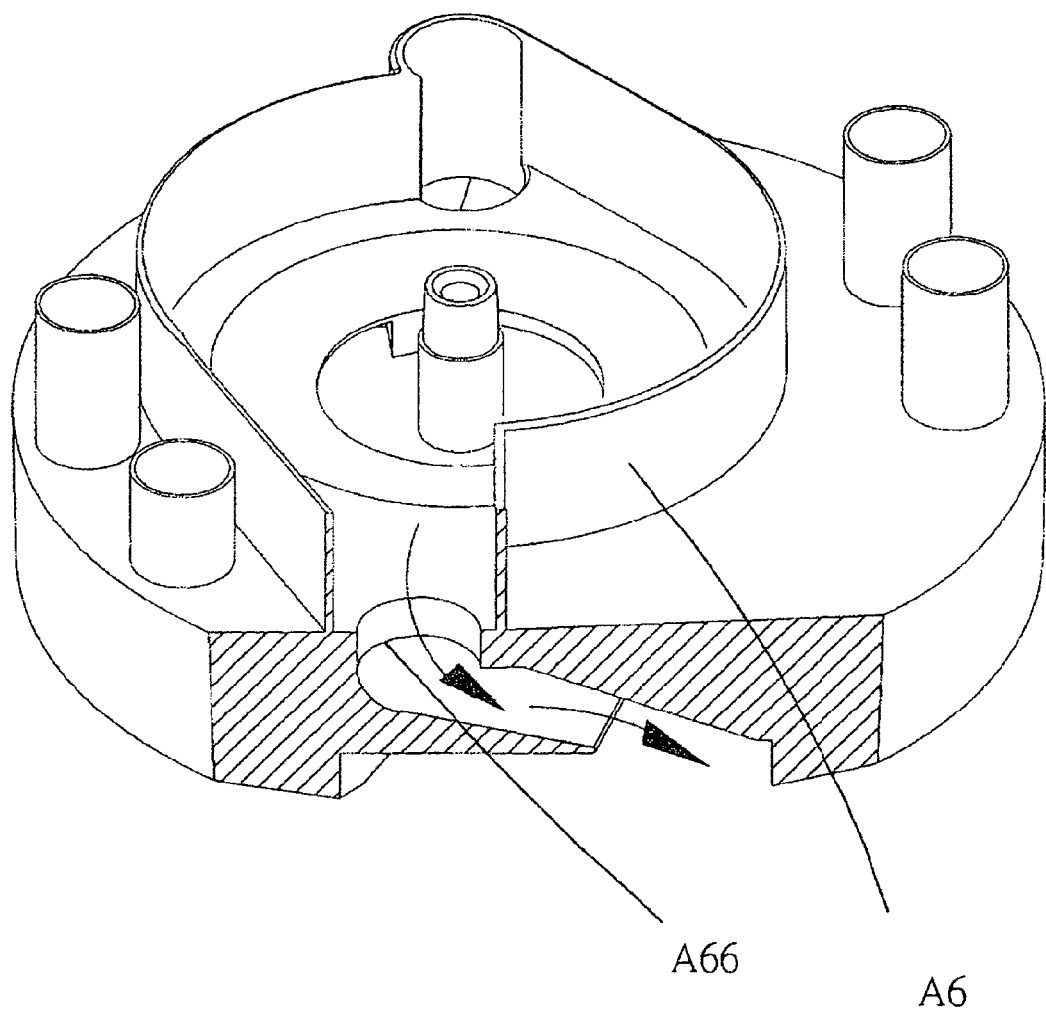
FIG. 6 is a perspective sectional view of the suction disk illustrating the guide port thereof for fluid flow.

Referring to FIG. 6, it can be seen clearly that the first and second guide ports A65, A66 (see FIG. 5) provide a mitigating passage respectively for the fluid being capable of moving to the base disk A3 (see FIG. 7) less harshly while the fluid flows to the base disk A3 via the guide ports A65, A66.

Figure 7:
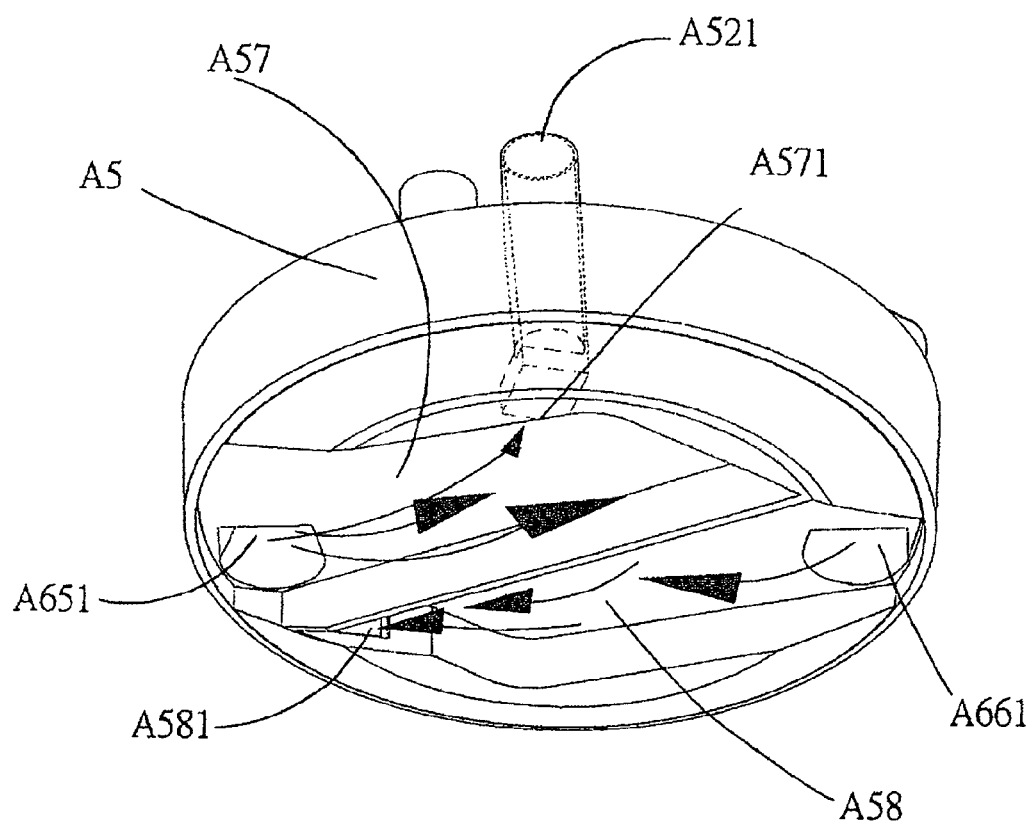
FIG. 7 is a perspective view of the suction disk projecting from the bottom thereof to illustrate direction of the fluid flow.

Referring to FIG. 7, it can be seen clearly that the first and second chambers A57, A58 at the bottom of the suction disk A5 are adjacent to each other, and the first and second guide ports A65, A66 extend to the first and second chambers A57, A58 with the first lower opening end A651 of the first guide port A65 communicating with first chamber A57 and the second lower opening end A58 communicating with the second chamber A58; the fluid enters and circulates in the first chamber A57 from the first inlet A51 via the first lower guide port opening end A651 of the first guide port A65 and then moves toward the first outlet A521 via a first discharge port A571 of the first chamber A57 such that the fluid can move outward the heat dissipation module A via the discharge pipe connector A104 of the cover 10 (see FIG. 1): In addition, the fluid enters and circulates in the second chamber A58 via the second lower opening end A661 of the second guide port A66 and then moves toward the second outlet A561 via a second discharge port A581 of the second chamber A58 such that the fluid can move outward the heat dissipation module A via the second discharge pipe connector A108 of the cover 10 (see FIG. 1).

Figure 8:
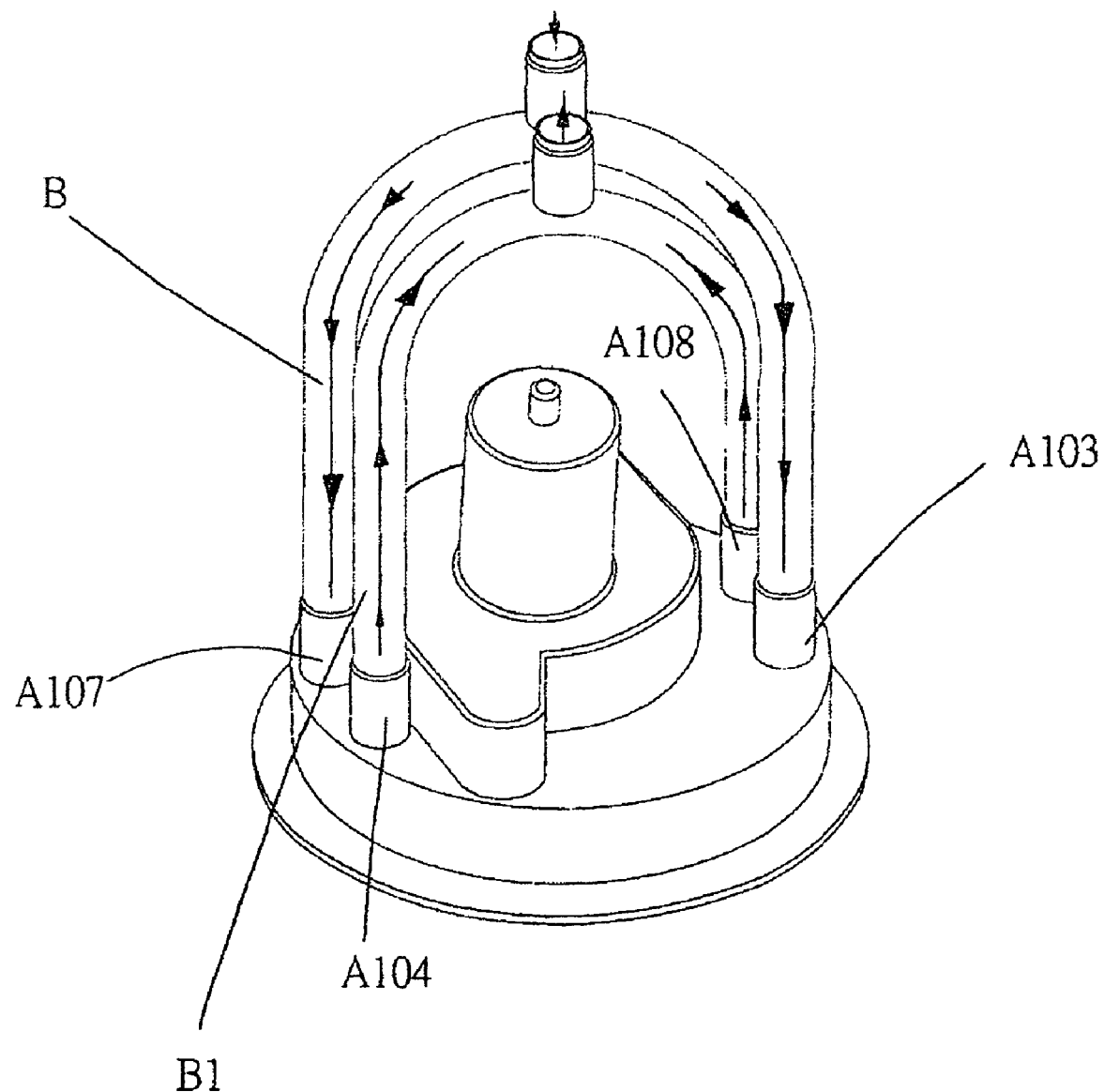
FIG. 8 is a perspective view of the water cooling type heat dissipation module according to the present invention illustrating water pipes being joined to the intake pipe connectors and the discharge pipe connectors respectively.

Referring to FIG. 8, a U-shaped water pipe B with two ends is connected to the first intake pipe connector A103 and the second intake pipe connector A107 to guide the fluid into the flow passages in the heat dissipation module A respectively and the fluid can move to the first discharge pipe connector A104 and the second discharge pipe connector A108 after circulating along the flow passages and leaves the heat dissipation module A via another U-shaped water pipe B1 with two ends thereof connecting with the first discharge pipe connector A104 and the second discharge pipe connector A 108. It can be seen in FIG. 8 that the water pipe B has an input opening at the middle thereof and the water pipe B1 has an output opening at the middle thereof.

It is appreciated that the water cooled heat dissipation module according to the present invention has the following advantages:

1. Heat from the heat generating component can be dissipated outward rapidly:

Due to the base disk A3 of the heat dissipation module A contacting with the heat generating component directly, the heat from the heat generating component can be conducted to the base disk A3 immediately and transmitted to the cooling strips A31 such that the heat from the heat generating component can be largely dissipated rapidly by means of the base disk A3 being full of moving water and the cooling strips A31 increasing area of the base disk contacting with the water.

2. Faster water circulation can be obtained:

The guide fan A7 is provided in the heat dissipation module A directly and the fluid in the heat dissipation module A is able to flow faster while the guide fan A7 runs such that the water can move outward and inward the heat dissipation module A more effectively. Meanwhile, the water pipes B, B1 can be connected to an external water circulation device to reduce burden of the external circulation device.

3. Better heat dissipation can be obtained effectively:

The suction disk provides two water chambers to perform fluid circulation independently for heat dissipation such that cooling effect can be enhanced substantively. In addition, once one of the water chambers is unable to perform fluid circulation due to the passage being blocked, the other water chamber is still capable of working all right for heat dissipation.

While the invention has been described with referencing to the preferred embodiment thereof, it is to be understood that modifications or variations may be easily made without departing from the spirit of this invention, which is defined by the appended claims.

What is claimed is:

1. A water cooling type heat dissipation module for an electronic device comprising:
   a base disk having a containing space with a plurality of cooling strips providing at the bottom thereof;
   a suction disk being disposed on top of said base disk, providing a first and second water chambers and having a first inlet and a first outlet communicating with the first water chamber and a second inlet and a second outlet communicating with the second water chamber respectively;
   a water guide being integrally joined to the top of said suction disk, providing a first guide port communicating with said first water chamber and a second guide port communicating with said second water chamber; and
   a cover for covering said suction disk, providing a first intake pipe connector and a first discharge pipe connector communicating with said first inlet and said first outlet respectively, and a second intake pipe connector and a second discharge pipe connector communicating with said second inlet and said second outlet respectively, and having a receiving shell for receiving a spindle and a guide fan, wherein the guide fan has a plurality of blades being enclosed with said water guide;
   a first U-shaped water pipe with two ends thereof connecting to the first and second intake pipe connectors respectively and having an input opening;
   a second U-shaped water pipes with two ends thereof connecting to the first and second discharge connectors respectively and having an output opening;
   wherein, the first chamber has a first discharge port, the second chamber has a second discharge port, and both the water chambers are located at the bottom of the suction disk and adjacent to each other; the first inlet with the first intake pipe connector is diagonally opposite to the second inlet with the second intake pipe connector, the first outlet with the first discharge pipe connector is diagonally opposite to the second outlet with the second discharge pipe connector, and the first and second water pipes are positioned to cross over each other partly;
   whereby, part of fluid from the first water pipe enters and circulates in the first chamber via the first guide port and then moves toward the first outlet via the first discharge port and outward the second water pipe via the first discharge pipe connector; another part of the fluid enters and circulates in the second chamber via the second guide port and then moves toward the second outlet via the second discharge port and outward the second water pipe via the second discharge pipe connector.

2. The heat dissipation module as defined in claim 1, wherein a guide opening is provided between said blades of said guide fan.

3. The heat dissipation module as defined in claim 1, wherein said water guide has a water hole for admitting fluid.

4. The heat dissipation module as defined in claim 1, wherein said first and second water pipes are made of material with food property of sealing such as rubber respectively.

5. The heat dissipation module as defined in claim 1, wherein said intake pipe connectors and said discharge pipe connectors connect with the first and second water pipes with a union tee respectively.

6. The heat dissipation module as defined in claim 1, wherein said intake pipe connectors and said discharge pipe connectors connect with the first and second water pipes independently.

7. The heat dissipation module as defined in claim 1, wherein each of said water pipes is bound with a binder.

8. The heat dissipation module as defined in claim 1, wherein a plurality of intake pipe connectors are provided for enhancing flow efficiency.

9. The heat dissipation module as defined in claim 8, wherein a plurality of inlets and outlets are provided to correspond to said intake pipe connectors and said discharge pipe connectors.

10. The heat dissipation module as defined in claim 1, wherein the respective guide port has a mitigating passage for fluid flowing into said base disk less harshly.

* * * * *